US012640219B2

(12) United States Patent
Ziaja et al.

(10) Patent No.: US 12,640,219 B2
(45) Date of Patent: May 26, 2026

(54) METHOD FOR SCANNING A MEMORY ARRAY

(71) Applicant: SambaNova Systems, Inc., Palo Alto, CA (US)

(72) Inventors: Thomas Ziaja, Austin, TX (US); Paul Jordan, Austin, TX (US)

(73) Assignee: SambaNova Systems, Inc., Palo Alto, CA (US)

( * ) Notice: Subject to any disclaimer, the term of this patent is extended or adjusted under 35 U.S.C. 154(b) by 193 days.

(21) Appl. No.: 18/403,700

(22) Filed: Jan. 3, 2024

(65) Prior Publication Data

US 2024/0412798 A1 Dec. 12, 2024

Related U.S. Application Data

(63) Continuation of application No. 18/207,482, filed on Jun. 8, 2023.

(51) Int. Cl.
*G11C 29/12* (2006.01)
*G11C 29/18* (2006.01)
(Continued)

(52) U.S. Cl.
CPC ........ *G11C 29/30* (2013.01); *G11C 29/12015* (2013.01); *G11C 29/18* (2013.01);
(Continued)

(58) Field of Classification Search
CPC ... G11C 29/30; G11C 29/12015; G11C 29/18; G11C 2029/1802; G11C 2029/3202; G11C 29/32
See application file for complete search history.

(56) References Cited

U.S. PATENT DOCUMENTS 5,550,843 A 8/1996 Yee
6,546,505 B1 * 4/2003 Swoboda ....... G01R 31/318342
714/E11.169

(Continued)

FOREIGN PATENT DOCUMENTS

WO 2010142987 A1 12/2010

OTHER PUBLICATIONS

M. Emani et al., Accelerating Scientific Applications With Sambanova Reconfigurable Dataflow Architecture, in Computing in Science & Engineering, vol. 23, No. 2, pp. 114-119, Mar. 26, 2021, [doi: 10.1109/MCSE.2021.3057203].

(Continued)

*Primary Examiner* — Mohammed A Bashar
(74) *Attorney, Agent, or Firm* — FP; Andre Henri Grouwstra; Sikander M. Khan

(57) ABSTRACT

A method is disclosed for scanning an array of memory cells arranged in rows and columns, where the array includes a scan chain partitioned into multiple sections. Each section includes a first scan multiplexer, a section buffer cell, and multiple memory cells. The method includes determining whether a scan shift mode is entered, asserting a scan enable signal to select second inputs of each first scan multiplexer when the scan shift mode is entered, coupling the scan input with the input of the section buffer cell of the first section, and coupling the output of the memory cell in the previous section with the input of the section buffer cell in the next section. The method further includes updating the contents of the section buffer cell and the memory cells using clock signals and scan word line pulses.

3 Claims, 12 Drawing Sheets

(51) Int. Cl.
   *G11C 29/30* (2006.01)
   *G11C 29/32* (2006.01)
(52) U.S. Cl.
   CPC ................ *G11C 2029/1802* (2013.01); *G11C 2029/3202* (2013.01)

(56) References Cited

U.S. PATENT DOCUMENTS

| | | | |
|---|---|---|---|
| 10,162,005 B1 * | 12/2018 | Alzheimer ..... | G01R 31/318547 |
| 2004/0190331 A1 * | 9/2004 | Ross .................. | G11C 29/1201 |
| | | | 365/154 |
| 2017/0115342 A1 | 4/2017 | Wang | |
| 2022/0139478 A1 * | 5/2022 | Ziaja ...................... | G11C 29/36 |
| | | | 714/726 |

OTHER PUBLICATIONS

Podobas et al., A Survey on Coarse-Grained Reconfigurable Architectures From a Performance Perspective, IEEEAccess, vol. 2020. 3012084, Jul. 27, 2020, 25 pages.

* cited by examiner

Write data 121    120    121

CLK

110

130

ADD0

111

ADD1

ADDN-1

ADDR

140

141    141

Read data

FIG. 1 – PRIOR ART

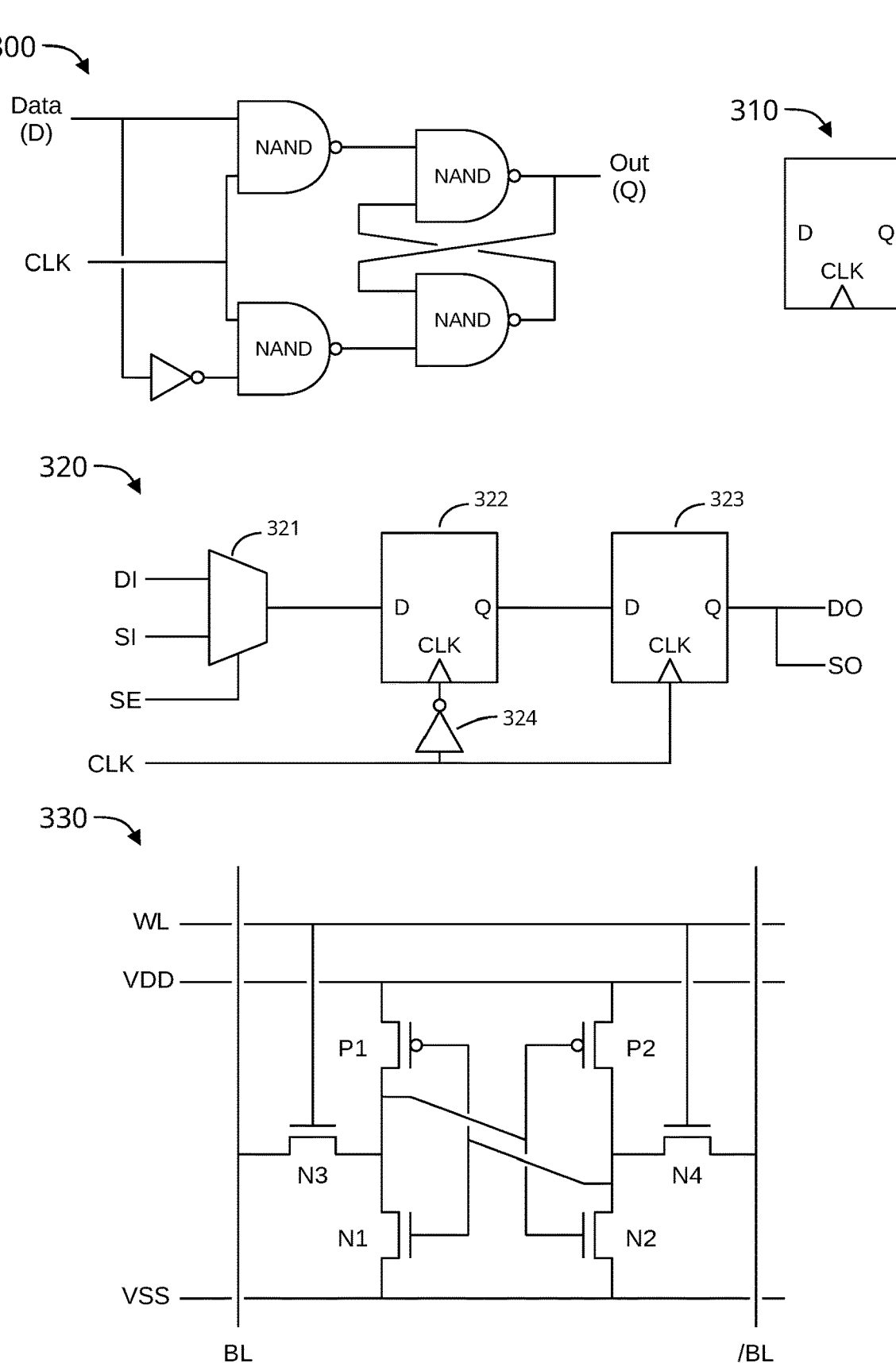
FIG. 3 – PRIOR ART

400

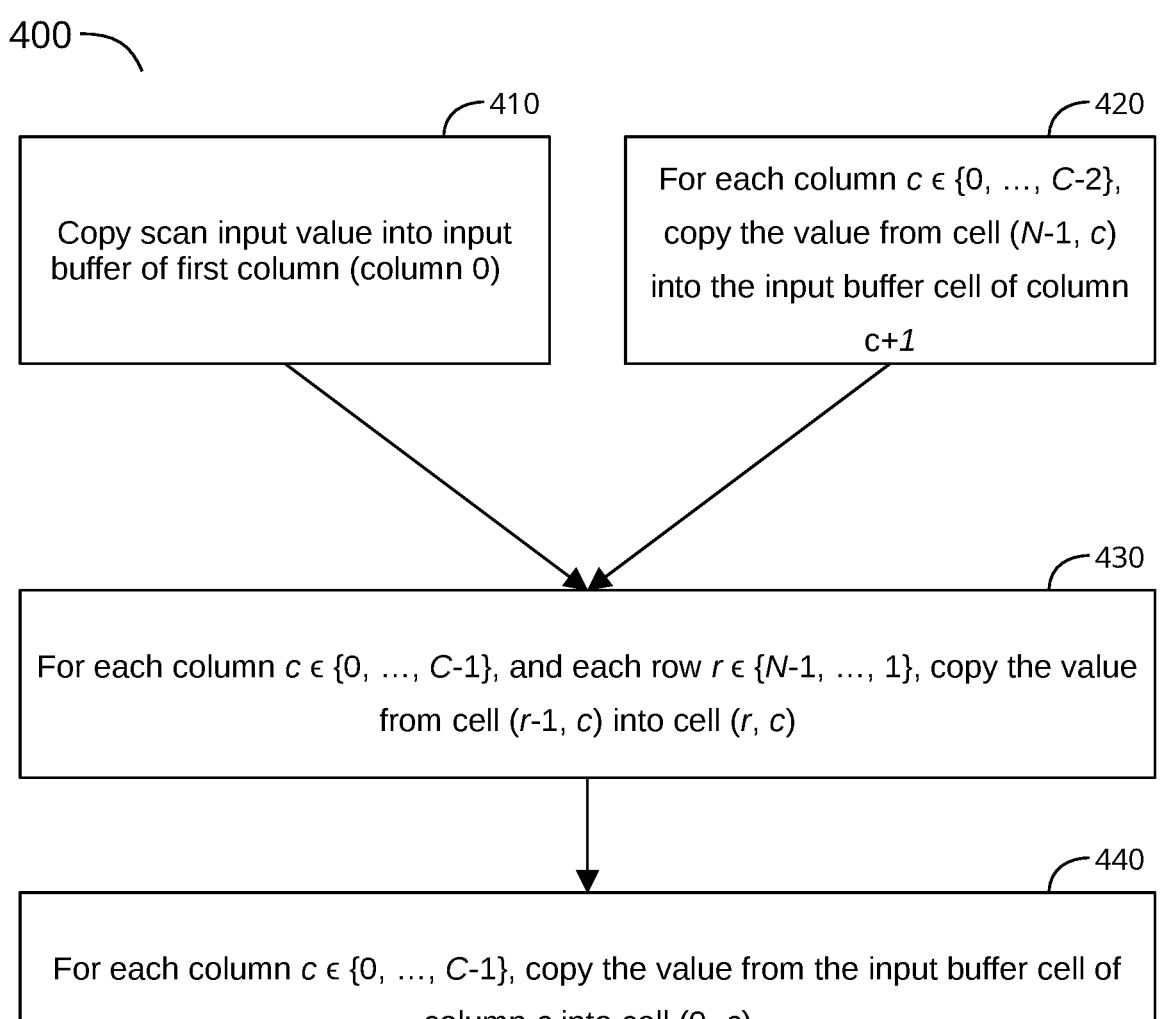

410

Copy scan input value into input buffer of first column (column 0)

420

For each column $c \in \{0, ..., C\text{-}2\}$, copy the value from cell ($N$-1, $c$) into the input buffer cell of column $c+1$

430

For each column $c \in \{0, ..., C\text{-}1\}$, and each row $r \in \{N\text{-}1, ..., 1\}$, copy the value from cell ($r$-1, $c$) into cell ($r$, $c$)

440

For each column $c \in \{0, ..., C\text{-}1\}$, copy the value from the input buffer cell of column $c$ into cell (0, $c$)

FIG. 4

FIG. 6 - Write Word Line Pulse Timing

FIG. 8 – Scanning, scan clock

FIG. 9 – Scanning, scan word line (SWL) pulses

1000

1100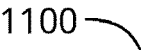

1101
Both CLK and
SE are de-asserted

1102
Enter scan shift?

1104 — Y
Assert SE to
enter scan
shift mode

1103 — N
Next CLK
pulse

1105
Select 2nd input of
scan muxes

1110
MX1C0
couples SI with D of IB/C0

1111
For x ∈ {0, c-2}, MX1Cx+1
couples Q of Rm-1Cx with D of
IB/Cx+1

1120
Assert CLK

1130
For each column Cx, coupling the
output of memory cell Rm-1Cx with
the column Cx scan output

1140
For each column Cx, and each
memory cell in column Cx, going
backwards, enable memory cell to
copy its input value to its output

1150
De-assert CLK

1160
Stay in scan shift mode?

1170 — N
De-assert SE
to exit scan
shift mode

METHOD FOR SCANNING A MEMORY ARRAY

REFERENCES

This application is a continuation of U.S. patent application Ser. No. 18/207,482, entitled "Fully Scannable Memory Arrays", filed on Jun. 8, 2023, which is hereby incorporated by reference, as if it is set forth in full in this specification.

BACKGROUND

Technical Field

The technology disclosed relates to the fields of design and test of integrated circuits (ICs), and more particularly, to Design for Test (DFT) and diagnostics involving on-chip memory. In some implementations, an IC may include scannable memory that may use one or more of automatic test pattern generation (ATPG), transition testing, and memory built-in self-test (MBIST).

Context

The subject matter discussed in this section should not be assumed to be prior art merely as a result of its mention in this section. Similarly, a problem mentioned in this section or associated with the subject matter provided as background should not be assumed to have been previously recognized in the prior art. The subject matter in this section merely represents different approaches, which in and of themselves can also correspond to implementations of the claimed technology.

ICs include various types of on-chip memories. Examples of such memories are working memory, cache, buffers, registers, first-in-first-out memories (FIFOs), lookup tables (LUTs), and various types of queues. In many settings, memories must be stable and fast, and may occupy significant die area. Memories may include an array of latches, an array of static random-access memory (SRAM) cells, an array of content-addressable memory (CAM) cells, or an array of master-slave flip-flops.

Whereas scan provides simple testing for flip-flops and logic, no such simple testing exists for other memories. The technology disclosed adds scan to memory arrays. This means that the memory arrays can be scan tested. More importantly, this means that the memory arrays can be scanned, i.e., the array contents can be fully controlled and observed through scan.

BRIEF DESCRIPTION OF THE DRAWINGS

The technology will be described with reference to the drawings, in which:

FIG. 3 illustrates conventional memory cells.

FIG. 4 illustrates an example method to perform a scan on an array of memory cells, in accordance with one implementation of the technology disclosed.

FIG. 11 illustrates an example method for scanning an array of memory cells as shown in FIG. 11.

Figure 1:
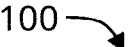
FIG. 1 illustrates a conventional memory array.

In the figures, like reference numbers may indicate functionally similar elements. The systems and methods illustrated in the figures, and described in the Detailed Description below, may be arranged and designed in a wide variety of different implementations. Neither the figures nor the Detailed Description are intended to limit the scope of the claims. Instead, they merely represent examples of different implementations of the disclosed technology.

DETAILED DESCRIPTION

Memory built-in self-test (MBIST) technology is expensive for two reasons. First, it requires an on-chip test controller that generates the test vectors and handles the test results. Second, during production testing of a chip, typically scan tests are performed first to quickly weed out malfunctioning circuits, and other tests such as built-in self-test (BIST) and/or MBIST are performed later in the cycle. The earlier a failure is detected, the shorter the test time, and thus the lower the test cost.

Memory that is scannable would solve such problems and obviate the need for BIST. The most basic memory cells are an SRAM cell and a latch, which can be made with as few as 4 to 8 transistors. A latch is made with two inverting gates, for example invertors or NAND gates or NOR gates, that are coupled in a ring. That is, an input of one is coupled with an output of the other. A latch is often drawn as a pair of cross-coupled inverting gates. In an SRAM cell, the latch is coupled with input/outputs via two pass transistors. A latch as used in a latch array has a clock input. As long as the clock input is asserted, data at the output follows data presented at the input of the latch. In conventional memory arrays, the lack of separation of the output of the latch and its input, when clocked, creates a problem when shifting data. For example, enabling a series of latches that are coupled in a chain updates data in all latches in the series, and overwrites and loses all data that was previously stored in the latches of the chain.

There are no prior solutions for creating a scannable memory array.

This technology disclosed herein makes memory arrays scannable without the large cost of traditional architectures. In particular, it allows memory arrays to be scanned, thereby supporting scan test, and catches all errors normally found during scan tests, including stuck-at faults and transition timing errors. The technology disclosed herein efficiently and effectively conducts scan testing of SRAM cells and latches as if they were flip-flops.

Terminology

The following terms or acronyms used herein are defined at least in part as follows:

ATPG—automatic test pattern generation.

BIST—built-in self-test. Tests generated and performed by on-chip circuits.

CAM—content-addressable memory.

DFT—design for test.

Flip-flop—a bistable circuit whose state can be changed at the time of an active edge of a clock pulse on a clock input.

IC—integrated circuit—a monolithically integrated circuit, i.e., a single semiconductor die that may be delivered as a bare die or as a packaged circuit. For the purposes of this document, the term integrated circuit also includes packaged circuits that include multiple semiconductor dies, stacked dies, or multiple-die substrates. Such constructions are now common in the industry, produced by the same supply chains, and for the average user often indistinguishable from monolithic circuits.

Latch—a bistable circuit whose state can be changed at any time, or during assertion of a clock input.

MBIST—memory built-in self-test. Tests generated and performed by on-chip circuits that are directed towards testing of memory.

Scan dump—a file of bit data which has been shifted out of a scan chain in a digital circuit and which is indicative for a state of scannable elements.

Scan testing—a method of testing integrated circuits that allows setting and observing the values of scannable elements in a design by, in a test mode, chaining the scannable elements in a scan chain, and shifting scan write data into the scannable elements or shifting read data out of the scannable elements. Scan testing provides an efficient way of finding stuck-at faults and transition timing errors.

Scanning—the process of moving scan bits stored in a scan chain by one position.

Shifting—see scanning.

SRAM—static random-access memory.

Implementations

FIG. 1 illustrates a conventional memory array 100. Memory array 100 includes an array of memory cells 110, input buffer 120, address decoder 130, and output circuits 140. Array of memory cells 110 includes memory cells 111, which may include latches, flip-flops, SRAM cells, DRAM cells, CAM cells, etc. In the case of latches, memory cells 111 may be called "slave latches". Input buffer 120 includes a series of input cells 121, which may include latches or flip-flops. Those latches may be called "master latches". In the case of an SRAM array, input cells 121 may further include bit line drivers, precharge circuits, and other circuits. When memory cells 111 and input cells 121 are latches, the combination of an input cell and a memory cell creates a master-slave flip-flop that can take in write data on a falling edge of CLK and move the write data into the memory cell on the rising edge of CLK. Address decoder 130 outputs a single set ADD0 . . . ADDN of address lines, as drawn. Multiple address decoders output multiple sets to support separate access actions. For example, two sets of address lines may support independent write and read accesses. Output circuits 140 may include output buffer cells, sense amplifiers, output multiplexers, and other circuits.

Write data is presented to input buffer 120, where each bit is routed to one of the input cells 121. The input cells may comprise latches that store the value of the write data at a trailing edge of a clock (CLK) cycle. The output of each of the input cells connects with the input of all memory cells 111 that are located in the same column as the input cell. Address decoder 130 receives an address ADDR and decodes it to a one-hot code on N address lines ADDN−1 . . . ADD0, at the leading edge of the CLK cycle. For example, ADDR=0 decodes into a HIGH for ADD0 and LOW for all other address lines. ADDR=1 decodes into a HIGH for ADD1 and LOW for all other address lines, etc. When an address line goes high on the leading edge of the CLK cycle, it asserts the clock inputs of all memory cells 111 in that row, and the bit values from input cells 121 that are present at the memory cells 111 inputs are copied into the memory cells 111 and stored until their clock inputs are asserted again.

Each of the memory cells 111 may either expose the stored value at its output permanently, or only when data access is clocked. The behavior depends on the implementation of the memory cell. Stored data is forwarded to output circuits 140 via a separate wire for each cell when exposed permanently, or via a wire that is shared by memory cells in the column if the data is only exposed when data access is clocked. Output circuits 140 combines the bits of the individual output cells 141 into a word or line of read data, which it outputs.

Memory array 100 is drawn without DFT functions, specifically without scan chain circuits.

One Mux Per Cell Implementation

Figure 2:
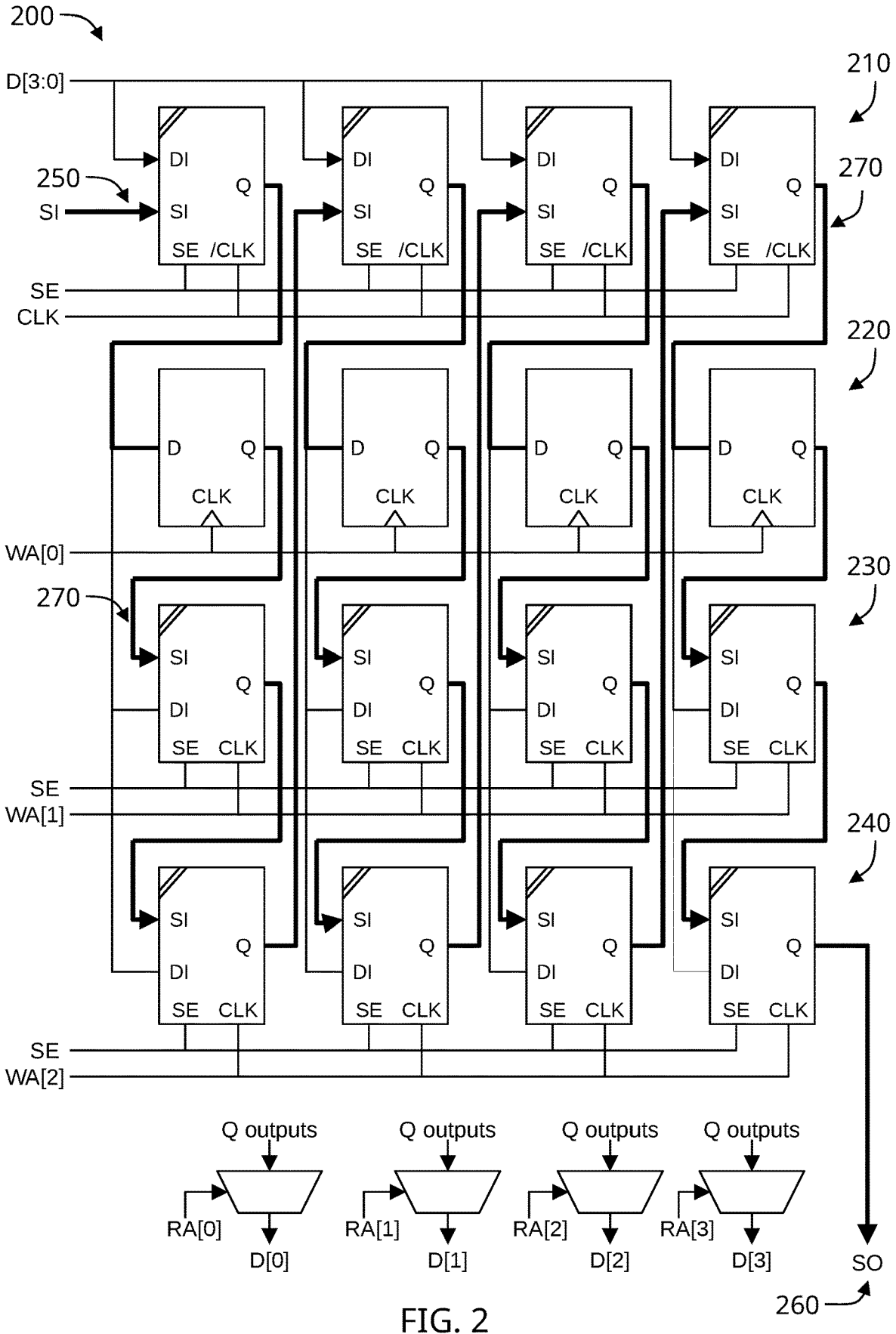
FIG. 2 illustrates an example of a scan chain in a fully scannable memory array, in accordance with one implementation of the technology disclosed.

FIG. 2 illustrates an example of a scan chain in a fully scannable memory array 200, in accordance with one implementation of the technology disclosed. In this implementation, data is accessed in rows, but scan chain 270 is stitched column-wise. FIG. 2 shows both the functional and scan paths of scan chain 270. Memory array 200 includes a row of input buffer cells 210. Input buffer cells 210 are latches with multiplexers with output Q, and inverted clock inputs. In data access mode, the input buffer cells 210 act as master latches that are each shared by the memory cells, which act as slave latches.

In the illustrated example, memory array 200 includes a first row of memory cells 220, a second row of memory cells 230, and a third row of memory cells 240. There may be multiple rows of memory cells. The memory cells are arranged in a matrix of rows and columns of latches, in the art sometimes denoted as "slave latches". When data D[3:0] is written into a row, it takes a full cycle of clock CLK, where the input buffer functions as a row of master latches, and the row of memory cells functions as a row of slave latches. The decoded write address lines WA[2:0] determines which row of latches is written into.

Memory array 200 uses a separate read address RA[2:0] so that data access for writing and reading can be performed independently. Thus, memory array 200 is a dual port memory. Although not drawn, each memory cell provides its Q output to the output multiplexer in the same column. Each multiplexer receives the decoded read controls and selects the Q output of the memory cell in the appropriate row. Other implementations may use latches with multiplexers with a separate output enable terminal, avoiding the need for many vertical wires in the array. Yet other implementations may use common row address lines A[2:0] for both read and write, so that the memory array becomes a single-port memory (albeit with separate input and output buffers) or use additional row addresses to add additional data access ports.

Although this example implementation has a memory array of 3 rows and 4 columns, other implementations may have any number of rows and any number of columns.

Memory array 200 may be placed in scan mode by asserting the scan enable (SE) signal. Scan in (SI) data enters the scan chain at scan input 250, in the first input buffer cell in the row of input buffer cells 210. When its clock input is deasserted (CLK goes high), the first input buffer cell in the row of input buffer cells 210 captures the scan in value, and the remaining memory cells in the row of input buffer cells 210 capture the contents of memory cells in a prior column in the third row of memory cells 240. On assertion of WA2 pulse, the memory cells in the third row of memory cells 240 capture the contents of memory cells in the second row of memory cells 230. On assertion of WA1 pulse, the memory cells in the second row of memory cells 230 capture the contents of memory cells in the first row of memory cells 220. On assertion of WA0 pulse, the memory cells in the first row of memory cells 220 capture the contents of the input buffer cells 210. The scan chain is stitched from the first memory cell in the first row of memory cells 220 to the first memory cell in the third row of memory cells 240, and via the input buffer cells 210 on to the second memory cell in the first row of memory cells 220, to the second memory cell in the third row of memory cells 240, and so on until the last memory cell in the third row of memory cells 240. The scan chain ends in the memory cell at the last row of the last column, where it exits memory array 200 at the scan output 260 (SO).

FIG. 3 illustrates conventional memory cells, including latch 300 with a clock input, scannable flip-flop 320, and SRAM cell 330. The symbol 310 represents latch 300. Latch 300 includes a pair of cross-coupled inverting gates, for example two-input NAND gates or two-input NOR gates, preceded by two two-input logic gates to provide a clock input. An additional inverter ensures that a data input signal (D) is available in positive and inverted versions. An output signal (Q) is taken from one of the cross-coupled inverting gates. An additional inverted output signal (/Q, not drawn) may be taken from the other of the cross-coupled inverting gates. As drawn, the clock signal CLK is positive, which means that latch 300 may copy the value of data signal D at any time to its output Q when CLK is high.

Scannable flip-flop 320 includes a master-slave flip-flop that comprises master latch 322, slave latch 323, and inverter 324. It further includes a scan multiplexer 321 that selects between a data input (DI) signal and a scan input (SI) signal, controlled by a scan enable (SE) signal. Scannable flip-flop 320 copies data from its input to its output after one full clock cycle of CLK. It may have a combined output for data out (DO) and scan out (SO) signals. In some cases, the scan out output is only clocked when SE is active, and high impedance otherwise.

SRAM cell 330 includes two cross-coupled inverting gates, for example inverters as shown. The first inverter has an N-type transistor N1 and a P-type transistor P1, the second inverter has an N-type transistor N2 and a P-type transistor P2. The two cross-coupled inverting gates can transition from one stable state to another stable state by overriding its output signals by stronger driver signals from bit lines BL and /BL. The bitlines can be connected via pass transistors N3 and N4, which have control inputs (gates) coupled with a word line WL. The bit lines function as bidirectional access lines to write data into SRAM cell 330 or to read data out of SRAM cell 330. SRAM cell 330 is known as a 6-transistor (6T) memory cell. In some cases, transistors P1 and P2 are replaced by high-value resistors to create a 4-transistor (4T) memory cell.

FIG. 4 illustrates an example method 400 to perform a scan of an array of memory cells, in accordance with one implementation of the technology disclosed. The array of memory cells has N rows (numbered 0 through N−1) and C columns (numbered 0 through C−1). Associated with each column is an input buffer cell. Each of the memory cells (r, c) is included in a scan chain. The scan chain has a scan input and a scan output. Method 400 comprises:

Step 410—copying the value of the scan input into the input buffer cell of column 0.

Step 420—for each column c, wherein c ranges from 0 to C−2, copying the value from cell (N−1, c) into the input buffer cell of column c+1. Also, the columns can be processed in parallel. Some implementations perform Step 410 in parallel with Step 420.

Step 430—for each column c and each row r, wherein c ranges from 0 through C−1 and r ranges from N−1 backwards through 1, copying the value from cell (r−1, c) to cell (r, c). Also, the columns can be processed in parallel.

Step 440—for each column c, wherein c ranges from 0 to C−1, copying the value from the associated input buffer cell into cell (0, c). Also, the columns can be processed in parallel.

Figure 5:
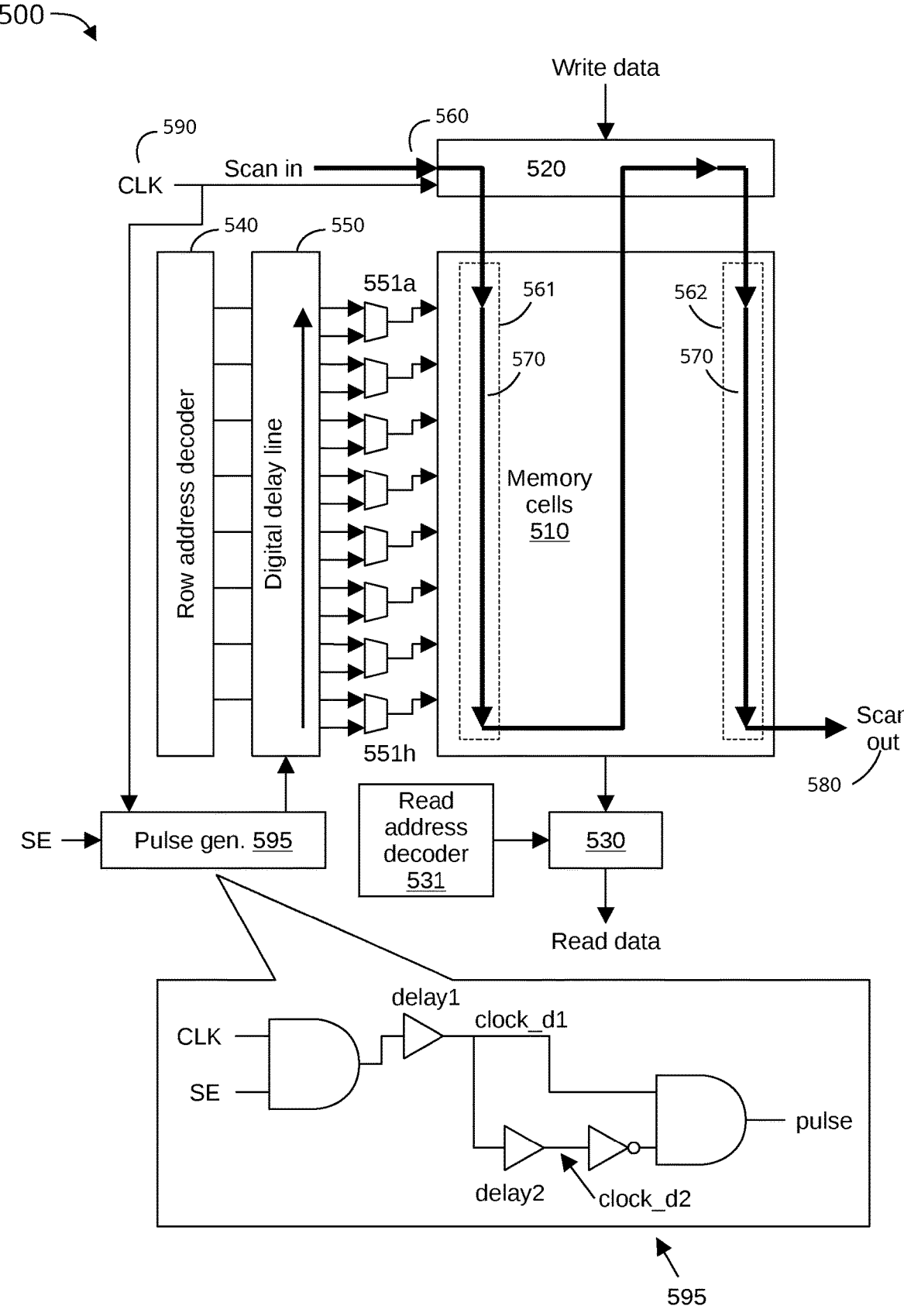
FIG. 5 illustrates an example memory array that is scannable in accordance with one implementation of the technology disclosed.

FIG. 5 illustrates an example memory array 500 that can execute a scan, in accordance with one implementation of the technology disclosed. For ease of explanation, memory array 500 has two columns 561 and 562 of memory cells 510. It has multiple rows (eight rows are shown). Memory array 500 includes an input buffer 520, an output multiplexer 530, a row address decoder 540, a digital delay line 550, a scan input 560, a scan chain 570, a scan output 580, a clock 590, and a pulse generator 595. The input to the row addresses decoder 540 is the write address. Also shown is a read address decoder 531 that accepts the read address and that controls the output multiplexer 530. Scan chain 570 traverses the columns 561 and 562.

Row address decoder 540 decodes the write address used for writing data into a row in the array of memory cells 510. The address is decoded into a one-hot code associated with the addressed row. Address lines with the one-hot code are forwarded to a bank of multiplexers 551a-551h, one of each associated with a row in the array of memory cells 510.

Digital delay line 550 creates a series of scan word line pulses, each associated with one row of in the array of memory cells 510. Outputs of digital delay line 550 are forwarded to the bank of multiplexers 551a-551h. Based on a scan enable (SE) signal, the bank of multiplexers 551a-551h either pass the one-hot address code or the scan word line pulses to the array of memory cells 510. Based on a clock pulse at clock 590, pulse generator 595 generates a short pulse that enters the digital delay line 550 at the bottom, traveling upward to the top. Thus, the last row in the array of memory cells 510 first receives a scan word line pulse, then the row before the last, going upwards until finally the top row receives the last scan word line pulse. This causes scan bits in the scan chain 570 to shift from scan input 560 towards the scan output 580.

Pulse generator 595 may include a circuit as shown, or any other circuit that derives a short pulse from the clock assertion. As shown, pulse generator 595 includes two delay elements, delay1 and delay2. Delay1 can be 0, but delay2 is greater than 0, and the resulting pulse meets the timing for the corresponding memory cell. When a clock pulse arrives, it is delayed by delay1, which outputs the delayed signal clock_d1. This delayed signal is delayed again, by delay2, to result in delayed signal clock_d2. A combinational logic circuit with a two-input AND gate and an inverter takes both signals clock_d1 and clock_d2 as input. The output pulse (the pulse generator output) is high only when clock_d1 is high and clock_d2 is not high yet. Thus, the duration of the pulse generator output equals the delay time of delay2 (plus the delay of the inverter). Many variations on this circuit are possible to implement the logic described above. In some implementations, the AND function on the clock pulse and the scan enable (SE) signal as illustrated as part of the pulse generator 595 are optional, and only a clock is needed.

Figure 6:
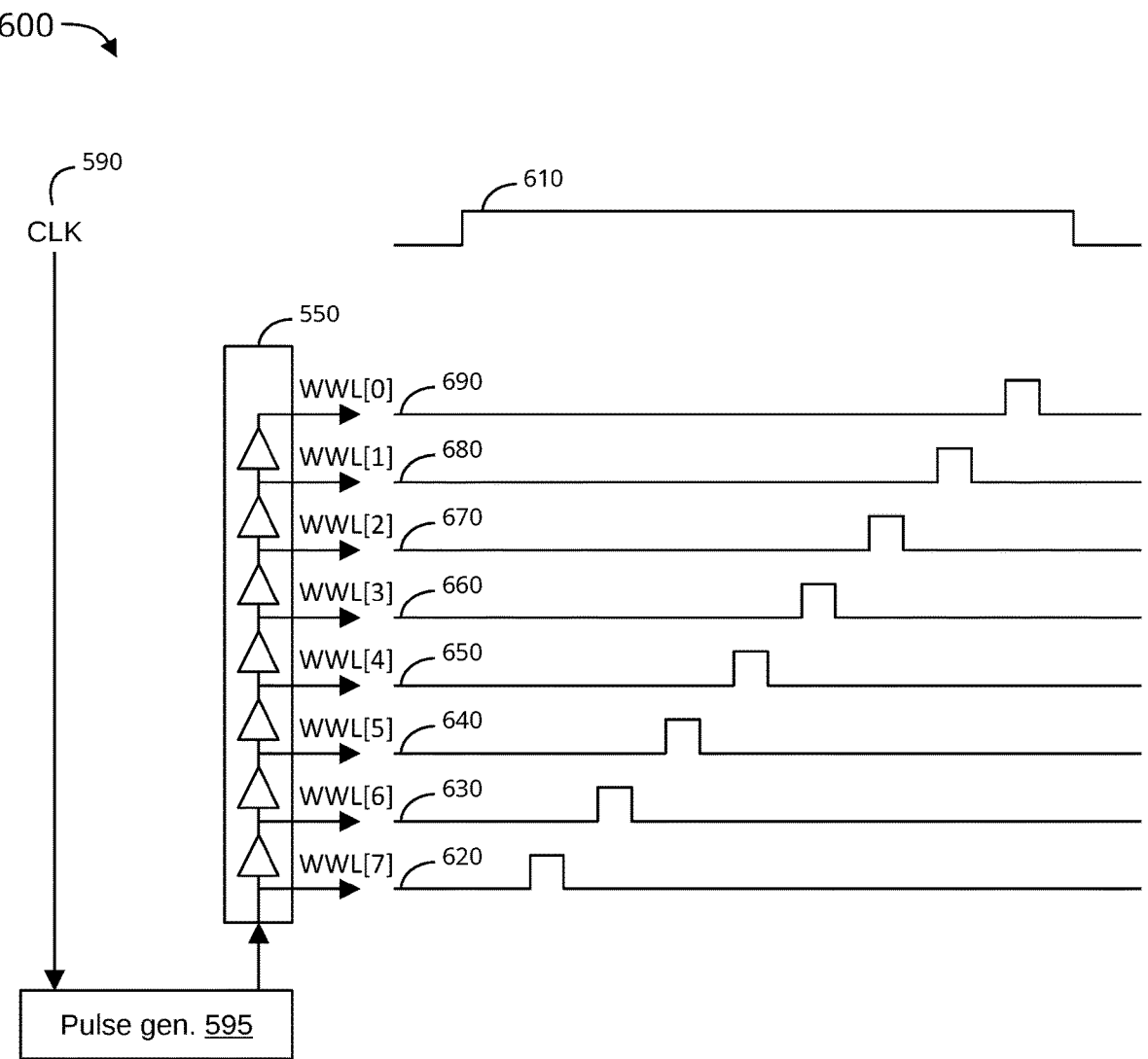
FIG. 6 illustrates an example of circuitry to generate scan word line pulses for the memory array of FIG. 5, in accordance with one implementation of the technology disclosed.

FIG. 6 illustrates an example 600 of digital delay line 550 to generate scan word line pulses for the memory array of FIG. 5, in accordance with one implementation of the technology disclosed. Clock 590 receives a clock pulse 610, which it forwards to the pulse generator 595. Pulse generator 595 generates a pulse generator output that it forwards to digital delay line 550. In the example implementation shown, digital delay line 550 forwards the pulse generator output to a first output, where it is shown as signal 620. The pulse generator output enters a first delay circuit, which may include one or more buffers, inverters, or other circuits that introduce delay, and the first delay circuit is coupled with a second output, which outputs signal 630. From the first delay circuit, the signal enters a second delay circuit, which outputs signal 640, and so on. Digital delay line 550 further outputs signal 650, signal 660, signal 670, signal 680, and signal 690. The number of outputs of digital delay line 550 may equal the number of rows in the array of memory cells. Although this implementation immediately outputs the scan word line pulse on the first output, another implementation may include a delay circuit before the first output. Jointly, signal 620 through signal 690 forms a sequence of non-overlapping pulses that all end before the trailing edge of clock pulse 610.

Figure 7:
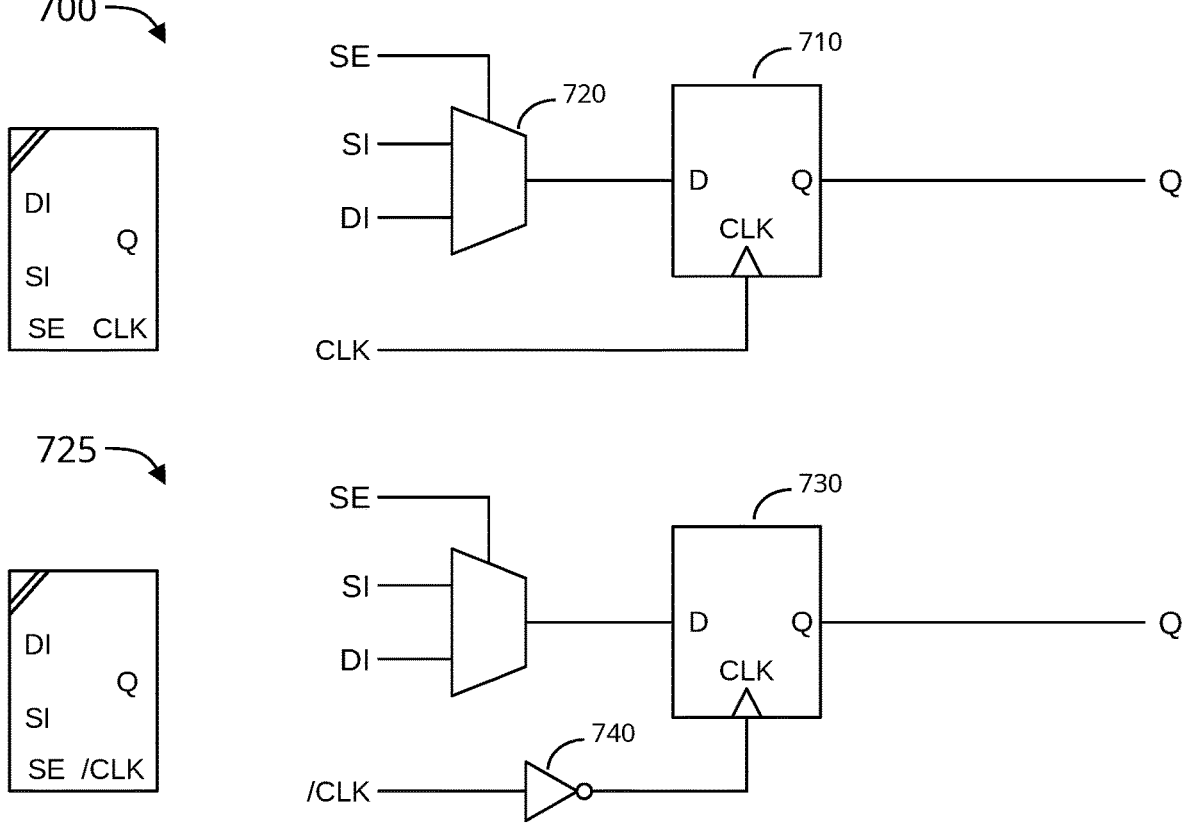
FIG. 7 shows symbols for latches with multiplexers used in this document.

FIG. 7 shows symbols for latches with multiplexers used in this document. A latch with multiplexer may have two inputs: a first input (DI) that provides functional data into the latch, and a second input (SI) that provides scan data into the latch. The latch with multiplexer may be in any of three modes: a functional write mode, a hold mode, and a scan mode. In the functional write mode, functional data is written into the latch. In the hold mode, the latch with multiplexer maintains its value and provides its held value on its Q output. In the scan mode, scan data is written into the latch. The mode of the latch with multiplexer can be determined by the values of a clock (CLK) signal and a scan enable (SE) signal. When the CLK signal is not asserted, the latch with multiplexer is in the hold mode. When the CLK signal is asserted and the SE signal is deasserted, the latch with multiplexer is in the functional write mode. When the clock signal is asserted and the SE signal is asserted, the latch with multiplexer is in scan mode.

A latch with multiplexer 700 includes latch 710 and scan multiplexer 720. Latch with multiplexer 700 has output Q which is used for both functional and scan paths. The stored value is permanently exposed and updated on the leading edge of the CLK signal. Scan multiplexer 720 selects between scan in (SI) data and functional data in (DI) data, dependent on the CLK signal.

A latch with multiplexer 725 with an inverted CLK input is very similar. The /CLK signal is inverted by inverter 740 and forwarded to the CLK input of latch 730.

Figure 8:
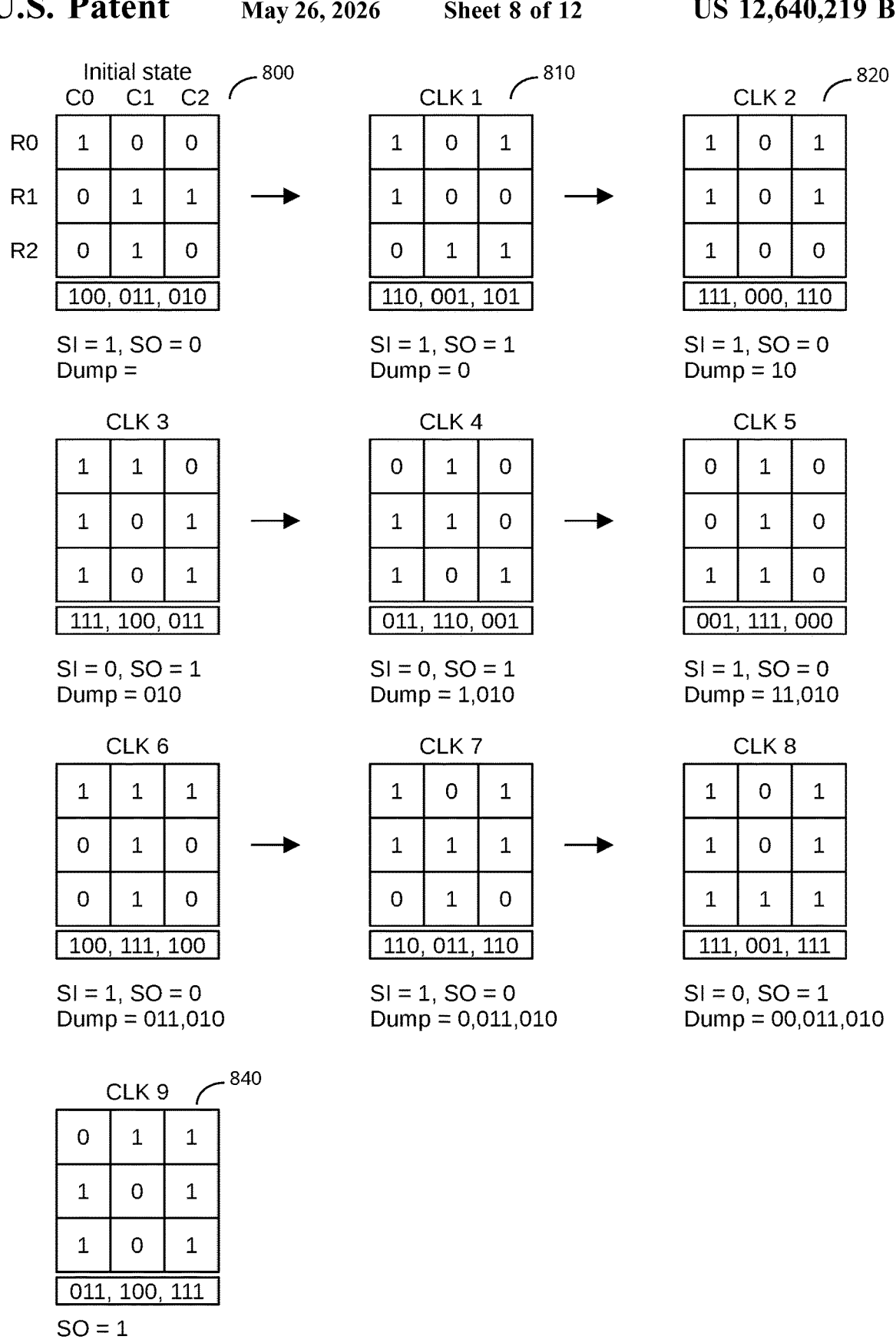
FIG. 8 illustrates an example of shifting scan data along the columns of a 3×3 memory array, in accordance with one implementation of the technology disclosed.

FIG. 8 illustrates an example of shifting scan data along the columns of a 3×3 memory array, in accordance with one implementation of the technology disclosed. The memory array has nine memory cells. The example shows how a current state is scanned out of the memory (into a scan dump), and how a new state is scanned into the memory. The initial state is shown in the first diagram 800. Row 0 stores the bits 1, 0, and 0; the second row 0, 1, and 1; and the third row 0, 1, and 0. These bit values may be the result of a functional operation, or of data that has been scanned in earlier. The scan chain runs along columns; therefore, the initial state of the scan chain is "100, 011, 010" as shown in the box below the nine cells. Scan out (SO) gets its value from the rightmost cell in the last row.

After the first cycle of the clock (diagram 810 Clock 1), all bits in the scan chain have shifted one position. Element R2C2 holds the initial value of element R1C2. Element R1C2 holds the initial value of element R0C2. Element R0C2 holds the initial value of element R2C1. Element R0C0 holds the previous scan in (SI) bit present at the initial state. The new scan in (SI) bit equals 1, which will be loaded in the Clock 2 (diagram 820).

After the second cycle of the clock (diagram 820 Clock 2), all bits in the scan chain have shifted one more position. Element R2C2 holds the Clock 1 value of element R1C2. Element R1C2 holds the Clock 1 value of element R0C2. Element R0C2 holds the Clock 1 value of element R2C1. Element R0C0 holds the previous scan in (SI) bit from Clock 1 (diagram 810). The new scan in (SI) bit equals 1, which will be loaded in the next Clock 3. This continues for several more clock cycles. The scan dump is maintained by adding new bits to the left and shifting existing bits to the right.

At the ninth cycle of the clock, (diagram 840 Clock 9), the SI bit has shifted in, and the full new test vector "011,100, 111" has been loaded. The initial value of element R0C0 is now the left most bit in the scan dump. The scan dump was empty at the initial state. The scan dump receives one bit after each clock cycle. After nine clock cycles, the scan dump has nine bits, and is now complete as "100,011,010".

Figure 9:
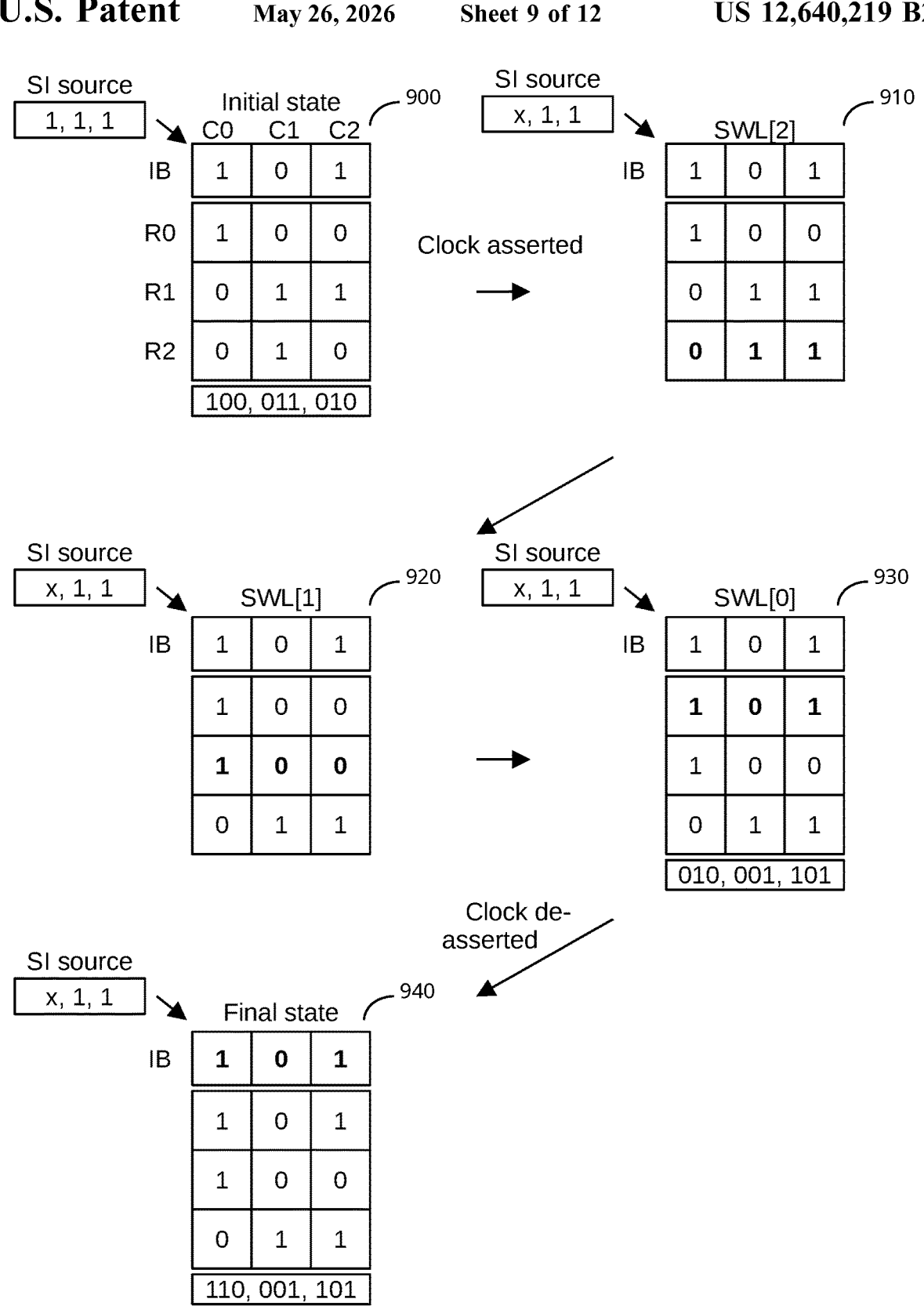
FIG. 9 illustrates an example of intermediate states of scanning data in the 3×3 memory array for successive scan word line pulses during shifting in FIG. 8, in accordance with one implementation of the technology disclosed.

FIG. 9 illustrates an example of intermediate states of shifting the scan data in the 3×3 memory array for successive scan word line pulses during the first stage of FIG. 8. The initial state is shown in diagram 900 when the clock is low, which equals the initial state shown in the first diagram 800 with the input buffer (IB) added. After the first scan word line pulse, the memory state is as shown in diagram 910. After the second scan word line pulse, the memory state is as shown in diagram 920. And after the third and final scan word line pulse, the memory state is as shown in diagram 930, which equals the clock 1 state shown in diagram 810. Note that in diagram 940, captured after the trailing edge of the clock, the input buffer stores the scan in SI bit in column C0 (value 1), a copy of the bit value of element R2C0 in column C1 (value 0), and a copy of the bit value of element R2C1 in column C2 (value 1). The input buffers have been added at the top. At the initial state (diagram 900, which equals diagram 800) the clock is de-asserted. Each intermediate state is entered by pulsing one of the non-overlapping scan word line pulses for one row. The equivalent memory cell value is shown below the initial and final states (diagrams 900=800 and 940=810); it has no meaning for intermediate states. Scan IN (SI)=0 at initial state, sourced by upstream cells. When clock is asserted, the SI source shifts one position to the right, but SI is not consumed until clock is de-asserted. Bold indicates updated values. Scan OUT (SO) tracks cell R2C2.

At the first scan word line pulse, affecting all memory cells in row R2, the values from row R1 have been copied into row R2. Row R2 has new values (printed bold in diagram 910), and rows R0 and R1 are unchanged.

At the second scan word line pulse, affecting all memory cells in row R1, the values from row R0 have been copied into row R1. Row R1 has new values (printed bold in diagram 920), and rows R0 and R2 are unchanged.

At the third and final scan word line pulse (diagram 930), values in row R0 have changed (printed in bold). The values for row R0 come from the input buffer row.

One Mux Per Column Implementation

Figure 10:
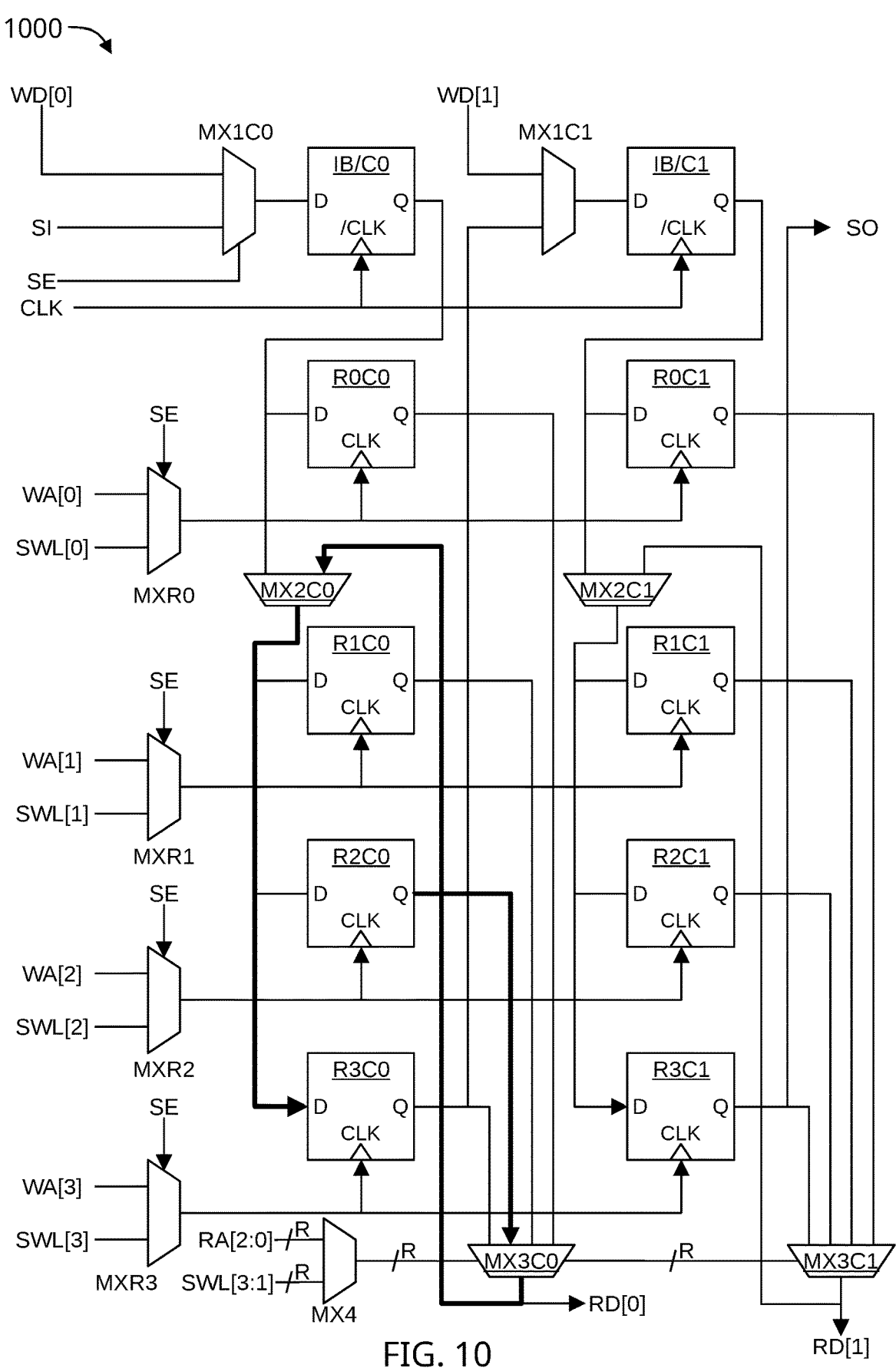
FIG. 10 illustrates an example array of memory cells without individual multiplexers, in which the memory cells are scannable.

FIG. 10 illustrates an example array of memory cells 1000 without individual multiplexers, in which the memory cells are scannable. Memory cells are arranged in N rows, numbered 0 through N−1, and C columns, numbered 0 through C−1. In this example, N=4 and C=2, but in other implementations N and C can be any values larger than zero. Each row comprises a word line multiplexer, and each column comprises a first scan multiplexer, a second scan multiplexer, a read multiplexer, and a column buffer cell. For example, row 0 includes word line multiplexer MXR0, row 1 includes word line multiplexer MXR1, etc. Column 0 comprises first scan multiplexer MX1C0, second scan multiplexer MX2C0, read multiplexer MX3C0, memory cells R0C0, R1C0, R2C0, and R3C0, and column buffer cell IB/C0. Column 1 comprises first scan multiplexer MX1C1, second scan multiplexer MX2C1, read multiplexer MX3C1, memory cells R0C1, R1C1, R2C1, and R3C1, and column buffer cell IB/C1. Memory cells and column buffer cells may each comprise a single latch. Each word line multiplexer, each first scan multiplexer, and each second scan multiplexer has a first input, a second input, and a scan enable input. These multiplexers are configured to couple the first input with the output when the scan enable input is deasserted and to couple the second input with the output when the scan enable input is asserted. The read multiplexer has N inputs. Each input n of the N inputs is coupled with an output of the memory cell in row n of that column, wherein n ranges from 0 to N−1. The read multiplexer selects an input based on a row read address applied to its select input.

The first input of the first scan multiplexer (MX1C0, MX1C1) in each column is coupled with a write data bit input, for example WD[0] for column 0 or WD[1] for column 1. The second input of the first scan multiplexer MX1C0 in column 0 is coupled with the scan chain input SI. The second input of the first scan multiplexer in each other column (e.g., MX1C1) is coupled with an output of the memory cell in row N−1 of a previous column (e.g., memory cell R3C). In an alternative implementation, the second input of the first scan multiplexer in each other column (e.g., MX1C1) is coupled with the output of the read multiplexer of the previous column (e.g., MX3C).

In each column, the output of the first scan multiplexer (MX1C0, MX1C1) is coupled with the input of the column buffer cell (IB/C0, IB/C1). The output of the column buffer cell (IB/C0, IB/C1) is coupled with the input of the memory cell in row 0 (R0C0, R0C1) and with the first input of the second scan multiplexer (MX2C0, MX2C1). The output of the second scan multiplexer (MX2C0, MX2C1) is coupled with inputs of memory cells in row 1 through N−1 (memory cells R1C0-R3C0 and R1C1-R3C1). The outputs of memory cells in rows 0 through N−1 (memory cells R0C0-R3C0 and R0C1-R3C1) are coupled with the inputs of the read multiplexer (MX3C0, MX3C1). The output of the read multiplexer (MX3C0, MX3C1) is coupled with the second input of the second scan multiplexer (MX2C0, MX2C1). Apart from the last column (column 1), the output of the memory cell in the last row (N−1) (memory cell R3C0) is coupled with the second input of the first scan multiplexer in the next column (MX1C1). In the last column, the output of the memory cell in the last row (N−1) (memory cell R3C1) is coupled with the scan chain output SO.

In each row, the output of the word line multiplexer is coupled with CLK inputs of memory cells in columns 0 through C−1. For example, in row 0 the output of word line multiplexer MXR0 is coupled with CLK inputs of memory cells R0C0 and R0C1.

In scan mode, the scan enable inputs of all word line multiplexers and of the first scan multiplexer and the second scan multiplexer are asserted.

When scan is enabled, each first memory cell in the scan columns (e.g., R0C0 and R0C1) is enabled by a scan word line SWL[0] signal; each second memory cell in the scan columns (e.g., R1C0 and R1C1) is enabled by a SWL[1] signal; etc. Each column buffer cell may be enabled by a clock signal. The last memory cells (R3C0 and R3C1) in the columns receive the first SWL pulse, in this case SWL[3]. The prior-to-last memory cells (R2C0 and R2C1) in the columns receive the next SWL pulse, in this case SWL[2]. The memory cells in the row previous to that (R1C0 and R1C1) receive the next SWL pulse, in this case SWL[1], and the memory cells in the first row (r0C0 and R0C1) receive the final SWL pulse, i.e., SWL[0]. The column buffer cells in the columns (IBC0 and IBC1) receive the last pulse, in this case the CLK.

The non-overlapping SWL pulses shift bits in the scan chain one by one. For example, the SWL[3] pulse copies the content of R2C0 into R3C0 as illustrated by the bold path in FIG. 10. The value of R2C0 is visible at its Q output and enters the read multiplexer MX3C0, which selects the signal and couples it to the second input of the second scan multiplexer MX2C0, and in some implementations to the second input of the first scan multiplexer the next column. This multiplexer selects the signal and couples it with the D inputs of R1C0-R3C0. Since only R3C0 is enabled (by the SWL[3] pulse), only R3C0 copies the value. Simultaneously and similarly, the second column copies the value of memory cell R2C1 to memory cell R3C1.

Once the values of R2C0 and R2C1 have been copied to R3C0 and R3C1, the next pulse SWL[2] copies the values of R1C0 and R1C1 into R2C0 and R2C1, etc. Finally, the CLK pulse copies the value of a column scan input into the column buffer cell. The read multiplexers MX3C0 and MX3C1 select their inputs synchronized with the timing of the SWL signals. However, they select an input from a different row than the active SWL signal. For example, when SWL[3] is active, they may select inputs from the third row instead of the fourth row, etc. There doesn't need to be a fixed offset. The row order could be scrambled by scrambling the addressing of the read multiplexers, as long as each row that is part of the scan chain is addressed once.

The multiplexer MX4, whose inputs and output are each R bits wide, controls input selection in the final multiplexers of the columns, i.e., in multiplexers MX3C0 and MX3C1. One of its inputs receives the decoded read row address (RA[3:0], provided by a read address decoder), which is used during normal operation; the other input receives the scan word lines (SWL[3:1]), which is used during scan mode. In some implementations, the scan word line bits (SWL[3:1]) are shifted by one bit position to be coupled with the MX4 input bits (2:0). In further implementations, the scan word line bits (SWL[3:1]) may be combined with CLK or the inverse of CLK.

FIG. 10 shows the second scan multiplexers (MX2C0 and MX2C1) as coupled between the first (R0C0, R0C1) and second (R1C0 and R1C1) memory cells. It highlights (bold lines) the case when SWL[3] is active and the content of R2C0 is copied into R3C0. At other times other SWL lines may be active and other memory cell values are copied. In some implementation different than the one depicted IN FIG. 10, the second scan multiplexers may be coupled between the column buffer cells (IB/C0 and IB/C1) and the first memory cells (R0C0 and R0C1). In those implementations, the Q output signal of the column buffer cell (IB/C0) is coupled with the first input of the second scan multiplexer (MX2C0) and may also be coupled with an input of the read multiplexer (MX3C0). In normal operation, the second scan multiplexer (MX2C0) couples the Q output of the column buffer cell (IB/C0) with all memory cells in the column (R0C0 . . . R3C0), and in scan mode, the second scan multiplexer (MX2C0) couples the output a selected cell (IB/C0 or any of the memory cells (R0C0 . . . R2C0) with the inputs of all memory cells in the column (R0C0 . . . R3C0).

FIG. 11 illustrates an example method 1100 for scanning an array of memory cells as shown in FIG. 11. Memory cells are arranged in m rows and c columns. Columns are numbered 0 through c−1. The array comprises a scan chain columned into at least two columns that are coupled in series. Each column has a scan input and a scan output. The scan input of the first column is coupled with the scan chain input. The scan input of the second column is coupled with the scan output of the first column, etc. The scan output of the last column is coupled with the scan chain output. Each column comprises m of the memory cells, numbered 0 through m−1, each with a memory cell enable input. The columns further include a first scan multiplexer, a second scan multiplexer, a read multiplexer, and a column buffer cell. The array further includes m cell multiplexers, each with an output coupled with one of the M memory cell enable inputs of the m memory cells of the columns. Method 1100 comprises:

Block 1101—both CLK and SE signals are de-asserted.

Step 1102—determining whether the scan shift mode is entered.

Step 1103—when the scan shift mode is not entered, waiting for a next CLK pulse and returning to Block 1101.

Step 1104—when the scan shift mode is entered, asserting SE to enter scan shift mode.

Step 1105—selecting second inputs of all scan multiplexers.

Step 1110—coupling the scan chain's SI input with an input of the column buffer cell of the first column. In some implementations, the coupling is performed by the first column's first scan multiplexer (e.g., MX1C0 couples SI with IB/C0 in FIG. 10).

Step 1111—for each column x, coupling the Q output of a last memory cell in column x (e.g., memory cell Rm-1Cx) with a D input of the column buffer cell in the next column x+1 (e.g., column buffer cell IB/Cx+1 in FIG. 10), wherein x ranges from 0 through c−2. Some implementations continuously couple the Q output of the last memory cell in column x with the D input of the column buffer cell in the next column x+1.

Some implementations perform Step 1110 and Step 1111 in parallel.

Step 1120—asserting CLK.

Step 1130—for each column Cx, wherein x ranges from 0 to c−1, coupling the output value of memory cell Rm-1Cx with the column Cx scan output.

Step 1140—for each column Cx, wherein x ranges from 0 to c−1, and each memory cell in column Cx, going backwards, enabling the memory cell to copy its input value to its output.

Some implementations perform Step 1130 and Step 1140 in parallel.

Step 1150—de-asserting CLK.

Step 1160—determining if the array of memory cells stays in scan shift mode. Upon determining that the array of memory cells stays in scan shift mode, returning to Step 1105.

Step 1170—upon determining that the array of memory cells does not stay in scan shift mode, de-asserting SE and returning to Step 1102.

Figure 12:
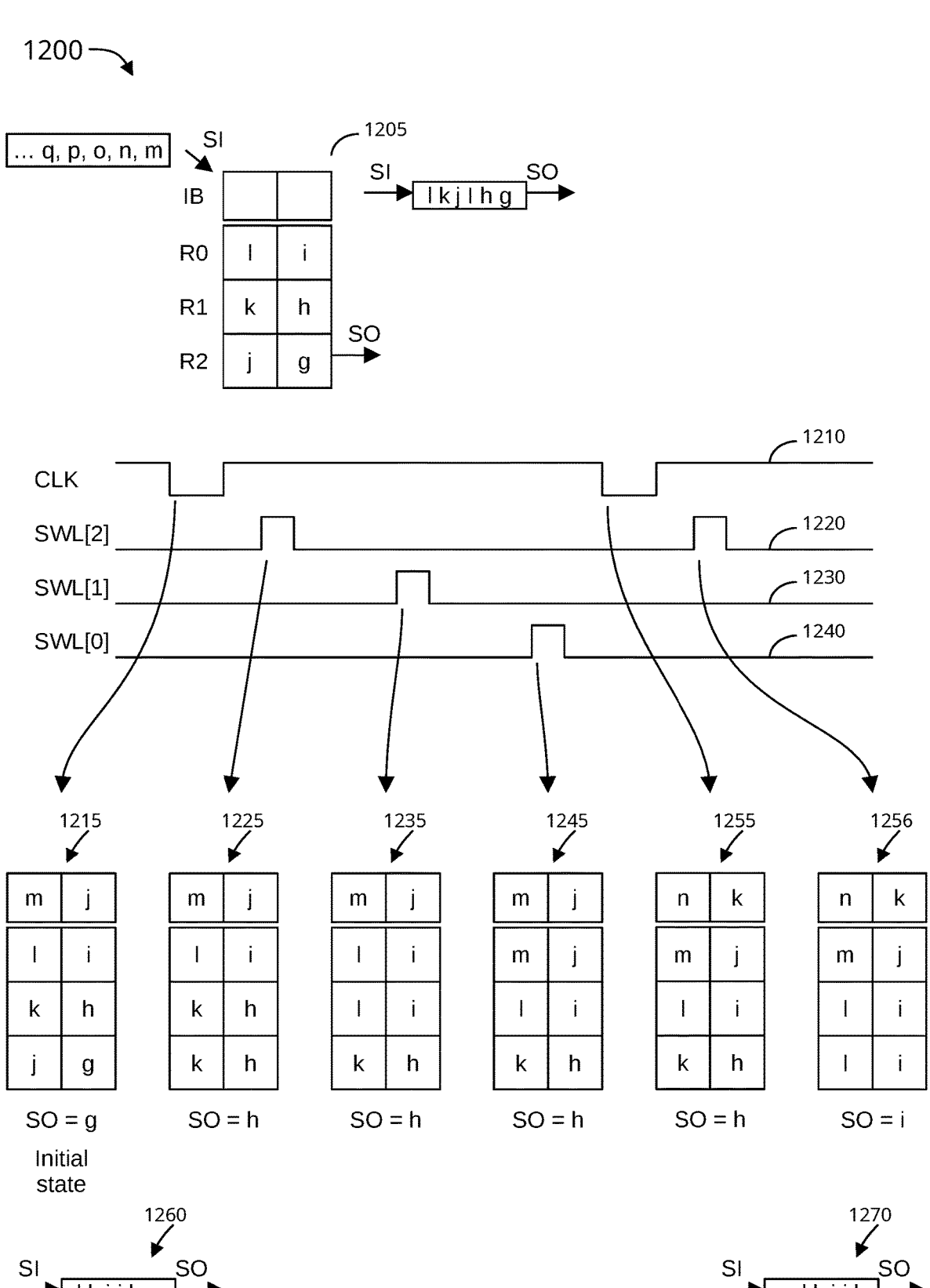
FIG. 12 illustrates timing of an example implementation of a three-rows by two-columns memory array.

FIG. 12 illustrates timing 1200 of an example implementation of a three-rows by two-columns memory array 1205. In this example, the scan chain is formed similar to the scan chain in FIG. 10, with one column for each of the columns. Each column includes a buffer cell that may be included in the input buffer IB, and three memory cells in rows R0, R1, and R2 respectively. The scan chain input (SI) is coupled with the buffer cell in the first column, and the scan chain output (SO) is coupled with the memory cell in row R2 of the second column. In the initial state, the rows hold the words (l, i), (k, h), and (j, g). The initial content 1260 of the scan chain is (l, k, j, i, g). The scan clock CLK is shown as CLK 1210. After one cycle of CLK 1210, the scan chain content 1270 is (m, l, k, j, i, h). During the cycle of CLK 1210, the non-overlapping signals SWL[2], SWL[1], and SWL[0] become active, respectively.

During a first deasserted period in CLK 1210, the memory array copies a scan input (SI) value (m) into the column buffer cell of the first column, and it copies the value of the last memory cell of the first column (j) into the column buffer cell of the second column. The resulting memory state is depicted in diagram 1215.

The wave form 1220 shows a first pulse and a second pulse in the SWL[2] signal, which is applied to memory cells in row R2. After the first pulse, the memory array has copied the content of row R1 to row R2, and the scan chain content is (l, k, k, i, h, h). The resulting memory state is depicted in diagram 1225.

The implementation applies a pulse in wave form 1230, which depicts the SWL[1] signal, to memory cells in row R1. After this pulse the memory content is as shown in diagram 1235, and the scan chain content is (l, l, k, i, i, h).

The implementation subsequently applies a pulse in signal SWL[0] as depicted in wave form 1240, resulting in the memory state depicted in diagram 1245, and scan chain content (m, l, k, j, i, h).

The implementation subsequently asserts the CLK 1210 (negative pulse), which results in an update of the buffer cells. As shown in diagram 1255, the buffer cell in the first column is updated with a new SI value (n), and the buffer cell in the second column is updated with the memory cell value of the last memory cell (row R2) in the first column, which holds the value (k).

Finally, after the second pulse in the SWL[2] signal, the implementation has updated row R2 with the values of row R1, as shown in diagram 1256, resulting in the next value of the scan chain output value SO.

Further or Additional Considerations

We describe various implementations of a scannable memory array.

The illustrated implementations have the columns of a latch array configured adjacent to one another within the scan chain. In other implementations, each column can be treated as its own 'subchain' and to arbitrarily connect these 'subchains' in any order and with any combination of other scannable primitives (i.e., scannable flops or columns of other column scannable latch arrays). When connecting scannable flops into a scan chain, the flop itself has no requirement or constraint on which flop drives its scan input or which flop receives its scan output. For the column scannable latch array, the column itself has no requirement or constraint on what drives its scan input or what receives its scan output. In essence, the column can be placed as a monolithic unit within the scan chain. Therefore, in some implementations of the technology disclosed, the column scan for a given column can be independent of the other columns. That is, each column can be considered stand-alone. So, the SI of any column could come from any other scan flop on the chip, and the SO for any column could go anywhere. The only restriction is that the scan chain stitch ordering and scan-related control must be the same for all columns in an array. In other words, the columns need not be "stitched together" into one contiguous scan chain for the whole array. Instead, each column could have its own "SI" from somewhere, and its "SO" could go somewhere other than within the array.

The technology disclosed can be practiced as a system, or method. One or more features of an implementation can be combined with the base implementation. Implementations that are not mutually exclusive are taught to be combinable. One or more features of an implementation can be combined with other implementations. This disclosure periodically reminds the user of these options. Omission from some implementations of recitations that repeat these options should not be taken as limiting the combinations taught in the preceding sections—these recitations are hereby incorporated forward by reference into each of the implementations described herein.

Although the description has been described with respect to particular implementations thereof, these particular implementations are merely illustrative, and not restrictive. The description may reference specific structural implementations and methods and does not intend to limit the technology to the specifically disclosed implementations and methods. The technology may be practiced using other features, elements, methods and implementations. Implementations are described to illustrate the present technology, not to limit its scope, which is defined by the claims. Those of ordinary skill in the art recognize a variety of equivalent variations on the description above.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Thus, while particular implementations have been described herein, latitudes of modification, various changes, and substitutions are intended in the foregoing disclosures, and it will be appreciated that in some instances some features of particular implementations will be employed without a corresponding use of other features without departing from the scope and spirit as set forth. Therefore, many modifications may be made to adapt a particular situation or material to the essential scope and spirit of the technology disclosed.

What is claimed is:

1. A method of scanning an array of memory cells arranged in R rows numbered 0 through R−1, and C columns numbered 0 through C−1, the array comprising a scan chain partitioned into at least two sections of each at least a part of a column comprising two or more cells, the at least two sections coupled in series between a scan input SI and a scan output SO, and each section comprising a first scan multiplexer, a section buffer cell, and M memory cells numbered 0 through M−1, the method comprising:

(a) determining whether a scan shift mode is entered;

(b) upon determining that the scan shift mode is not entered, returning to (a);

(c) upon determining that the scan shift mode is entered, asserting a scan enable signal SE to select second inputs of each first scan multiplexer;

(d) coupling the scan input SI with an input of the section buffer cell of a first of the at least two sections, and for each section s, wherein s ranges from 0 to S−2, coupling an output of memory cell in row M−1 with an input of the section buffer cell in section s+1;

(e) asserting and de-asserting a clock signal CLK to update contents of the section buffer cell of each of the at least two sections;

(f) for each of the at least two sections, and each memory cell m in a section, wherein m ranges backwards from M−1 to 1, coupling an input of memory cell m with an output of memory cell m−1, and asserting and de-asserting a single scan word line SWL pulse to update contents of the memory cell; and (g) for each of the at least two sections, and each memory cell m=0 in a section, coupling an input of memory cell m with an output of the section buffer cell, and asserting and de-asserting a single scan word line SWL pulse to update contents of the memory cell.

2. The method of claim 1, wherein:

each section further comprises a second scan multiplexer and a read multiplexer; and coupling an input of memory cell m with an output of memory cell m−1 includes routing an output signal of memory cell m−1 via the read multiplexer and the second scan multiplexer.

3. The method of claim 1, wherein:

memory cells contents in a section are updated with successive non-overlapping scan word line SWL pulses.

* * * * *